United States Patent
Hasegawa et al.

(10) Patent No.: US 10,844,476 B2
(45) Date of Patent: Nov. 24, 2020

(54) SPUTTERING TARGET MATERIAL

(71) Applicant: Sanyo Special Steel Co., Ltd., Himeji (JP)

(72) Inventors: Hiroyuki Hasegawa, Himeji (JP); Noriaki Matsubara, Himeji (JP)

(73) Assignee: Sanyo Special Steel Co., Ltd., Himeji (JP)

( * ) Notice: Subject to any disclaimer, the term of this patent is extended or adjusted under 35 U.S.C. 154(b) by 273 days.

(21) Appl. No.: 15/760,421

(22) PCT Filed: Sep. 16, 2016

(86) PCT No.: PCT/JP2016/077457
§ 371 (c)(1),
(2) Date: Mar. 15, 2018

(87) PCT Pub. No.: WO2017/047753
PCT Pub. Date: Mar. 23, 2017

(65) Prior Publication Data
US 2018/0245211 A1    Aug. 30, 2018

(30) Foreign Application Priority Data
Sep. 18, 2015  (JP) .................................. 2015-184644

(51) Int. Cl.
*C23C 14/34* (2006.01)
*C22C 19/07* (2006.01)
(Continued)

(52) U.S. Cl.
CPC ........ *C23C 14/3414* (2013.01); *B22F 1/0011* (2013.01); *B22F 9/08* (2013.01);
(Continued)

(58) Field of Classification Search
CPC ..... C23C 14/3414; C22C 38/10; B22F 1/0011
See application file for complete search history.

(56) References Cited

U.S. PATENT DOCUMENTS 9,208,812 B2   12/2015   Sawada et al.
9,269,389 B2    2/2016   Arakawa
(Continued)

FOREIGN PATENT DOCUMENTS

JP   2003226963 A    8/2003
JP   2004346423 A   12/2004
(Continued)

*Primary Examiner* — Christopher S Kessler
*Assistant Examiner* — Jiangtian Xu
(74) *Attorney, Agent, or Firm* — The Webb Law Firm (57) ABSTRACT

An object of the present invention is to reduce particles generated in sputtering, and in order to achieve such an object, there is provided a sputtering target material including in at. %: 10 to 50% of B; and the balance of at least one of Co and Fe, and unavoidable impurities, in which the intensity ratio $[I\ [(CoFe)_3B]/I\ [(CoFe)_2B]]$ of the X-ray diffraction intensity $[I\ [(CoFe)_3B]]$ of $(CoFe)_3B$ (121) to the X-ray diffraction intensity $[I\ [(CoFe)_2B]]$ of $(CoFe)_2B$ (200), the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200), or the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) is 1.50 or less.

4 Claims, 2 Drawing Sheets (51) Int. Cl.
*C22C 38/00* (2006.01)
*H01J 37/34* (2006.01)
*H01F 41/18* (2006.01)
*B22F 1/00* (2006.01)
*B22F 9/08* (2006.01)
*C22C 38/10* (2006.01)

(52) U.S. Cl.
CPC .............. *C22C 19/07* (2013.01); *C22C 38/00* (2013.01); *C22C 38/002* (2013.01); *C22C 38/10* (2013.01); *C23C 14/34* (2013.01); *H01F 41/183* (2013.01); *H01J 37/3426* (2013.01); *H01J 37/3429* (2013.01); *B22F 1/00* (2013.01); *B22F 2301/15* (2013.01); *B22F 2301/35* (2013.01); *B22F 2304/10* (2013.01)

(56) References Cited

U.S. PATENT DOCUMENTS

| | | |
|---|---|---|
| 2005/0011308 A1 | 1/2005 | Ueno et al. |
| 2007/0017803 A1 | 1/2007 | Ziani et al. |
| 2007/0251821 A1 | 11/2007 | Yanagitani et al. |
| 2015/0357170 A1 | 12/2015 | Ohashi et al. |
| 2016/0237552 A1* | 8/2016 | Arakawa ............... C22C 1/0433 |
| 2018/0019389 A1 | 1/2018 | Arakawa |

FOREIGN PATENT DOCUMENTS

| | | |
|---|---|---|
| JP | 2005320627 A | 11/2005 |
| JP | 200731827 A | 2/2007 |
| JP | 2012207274 A | 10/2012 |
| WO | 2011070860 A1 | 6/2011 |
| WO | 2012026405 A1 | 3/2012 |
| WO | 2015019513 A1 | 2/2015 |
| WO | 2015080009 A1 | 6/2015 |
| WO | 2015166762 A1 | 11/2015 |
| WO | 2016140113 A1 | 9/2016 |

* cited by examiner

SPUTTERING TARGET MATERIAL

CROSS-REFERENCE TO RELATED APPLICATIONS

This application is the United States national phase of International Application No. PCT/JP2016/077457 filed Sep. 16, 2016, and claims priority to Japanese Patent Application No. 2015-184644 filed Sep. 18, 2015, the disclosures of which are hereby incorporated in their entirety by reference.

BACKGROUND OF THE INVENTION

Field of the Invention

The present invention relates to a sputtering target material useful for producing an alloy thin film in a magnetic tunneling junction (MTJ) element, an HDD, a medium for magnetic recording, or the like.

Background Art

A magnetic random-access memory (MRAM) includes a magnetic tunneling junction (MTJ) element. Such a magnetic tunneling junction (MTJ) element has a structure such as CoFeB/MgO/CoFeB and exhibits features such as a high tunnel magnetoresistance (TMR) signal and a low switching current density (Jc).

A CoFeB thin film of a magnetic tunneling junction (MTJ) element is formed by sputtering a CoFeB target. Examples of known CoFeB sputtering target materials include a sputtering target material including a fine structure utilizing the rapidly solidified structure of an atomized powder that is rapidly solidified, as disclosed in Japanese Patent Laid-Open Publication No. 2004-346423 (Patent Literature 1).

CITATION LIST

Patent Literature

[PTL 1] Japanese Patent Laid-Open Publication No. 2004-346423

SUMMARY OF THE INVENTION

The sputtering target material including the fine structure utilizing the rapidly solidified structure of Patent Literature 1 has a problem that particles are generated in sputtering.

As a result of intensively advancing development in order to solve the problem described above, the present inventors found that the rapidly solidified structure of an atomized powder produced by rapid solidification in gas atomization includes a small amount of primary crystals without a boride phase but includes formed $(CoFe)_3B$, $Co_3B$, or $Fe_3B$, and particles in sputtering can be reduced by removing $(CoFe)_3 B$, $Co_3B$, or $Fe_3B$ from the atomized powder used as a raw material of a sputtering target material. Thus, the present invention was accomplished.

The present invention encompasses the following inventions:

[1] A sputtering target material comprising in at. %: 10 to 50% of B; and the balance of at least one of Co and Fe, and unavoidable impurities,
wherein the intensity ratio $[I\ [(CoFe)_3B]/I\ [(CoFe)_2B]]$ of the X-ray diffraction intensity $[I\ [(CoFe)_3B]]$ of $(CoFe)_3B$ (121) to the X-ray diffraction intensity $[I\ [(CoFe)_2B]]$ of $(CoFe)_2B$ (200), the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200), or the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) is 1.50 or less.

[2] The sputtering target material according to the above [1], wherein the sputtering target material comprises the balance of Co and Fe, and unavoidable impurities; and the intensity ratio $[I\ [(CoFe)_3B]/I\ [(CoFe)_2B]]$ of the X-ray diffraction intensity $[I\ [(CoFe)_3B]]$ of $(CoFe)_3B$ (121) to the X-ray diffraction intensity $[I\ [(CoFe)_2B]]$ of $(CoFe)_2B$ (200) is 1.50 or less.

[3] The sputtering target material according to the above [1], wherein the sputtering target material comprises the balance of Co and unavoidable impurities; and the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200) is 1.50 or less.

[4] The sputtering target material according to the above [1], wherein the sputtering target material comprises the balance of Fe and unavoidable impurities; and the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) is 1.50 or less.

According to the present invention, there is provided a sputtering target material that includes a small amount of $(CoFe)_3B$, $Co_3B$, or $Fe_3B$ and enables generation of particles to be suppressed in sputtering. The sputtering target material of the present invention exhibits the very excellent effect of enabling improvement in the product yield of a sputtering film.

DETAILED DESCRIPTION OF THE INVENTION

The present invention will be described in detail below. Unless otherwise specified, "%" in the present invention means at. %.

In a sputtering target material according to the present invention, the content of B is 10 to 50%. An alloy thin film formed in sputtering does not sufficiently become amorphous when the content of B is less than 10%, while it is impossible to reduce particles generated in sputtering when the content of B is more than 50%. Therefore, the content of B is adjusted to 10 to 50%. The content of B is preferably 20 to 50%.

The sputtering target material according to the present invention comprises the balance of at least one of Co and Fe, and unavoidable impurities.

Co and Fe are elements that impart magnetism. The total content of Co and Fe is 50% or more. When the sputtering target material according to the present invention contains only one of Co and Fe, "total content of Co and Fe" means the content of the one. The sputtering target material according to the present invention may contain up to 1000 ppm of unavoidable impurities.

When the sputtering target material according to the present invention comprises the balance of Co and Fe, and unavoidable impurities, the intensity ratio [I [(CoFe)$_3$B]/I [(CoFe)$_2$B]] of the X-ray diffraction intensity [I [(CoFe)$_3$B]] of (CoFe)$_3$B (121) to the X-ray diffraction intensity [I [(CoFe)$_2$B]] of (CoFe)$_2$B (200) is 1.50 or less. The intensity ratio [I [(CoFe)$_3$B]/I [(CoFe)$_2$B]] is, for example, 1.4 or less, 1.3 or less, 1.2 or less, 1.1 or less, 1.0 or less, 0.9 or less, 0.8 or less, 0.7 or less, 0.6 or less, or 0.5 or less. The lower limit value of the intensity ratio [I [(CoFe)$_3$B]/I [(CoFe)$_2$B]] is 0.0. The X-ray diffraction intensity [I [(CoFe)$_2$B]] of (CoFe)$_2$B (200) means the intensity of the peak belonging to the (200) plane of (CoFe)$_2$B among X-ray diffraction peaks measured using a Cu-Kα ray, and the X-ray diffraction intensity [I [(CoFe)$_3$B]] of (CoFe)$_3$B (121) means the intensity of the peak belonging to the (121) plane of (CoFe)$_3$B among X-ray diffraction peaks measured using a Cu-Kα ray. The reason that the X-ray diffraction intensity of the (200) plane of (CoFe)$_2$B and the X-ray diffraction intensity of the (121) plane of (CoFe)$_3$B are used as indices is because the peak of the (200) plane of (CoFe)$_2$B and the peak of the (121) plane of (CoFe)$_3$B do not overlap with other compound peaks and are independent from the other compound peaks as long as being within the ranges of the compositions of the present invention.

When the sputtering target material according to the present invention comprises the balance of Co and unavoidable impurities, the intensity ratio [I (Co$_3$B)/I (Co$_2$B)] of the X-ray diffraction intensity [I (Co$_3$B)] of Co$_3$B (121) to the X-ray diffraction intensity [I (Co$_2$B)] of Co$_2$B (200) is 1.50 or less. The intensity ratio [I (Co$_3$B)/I (Co$_2$B)] is, for example, 1.4 or less, 1.3 or less, 1.2 or less, 1.1 or less, 1.0 or less, 0.9 or less, 0.8 or less, 0.7 or less, 0.6 or less, or 0.5 or less. The lower limit value of the intensity ratio [I (Co$_3$B)/I (Co$_2$B)] is 0.0. The X-ray diffraction intensity [I (Co$_2$B)] of Co$_2$B (200) means the intensity of the peak belonging to the (200) plane of Co$_2$B among X-ray diffraction peaks measured using a Cu-Kα ray, and the X-ray diffraction intensity [I (Co$_3$B)] of Co$_3$B (121) means the intensity of the peak belonging to the (121) plane of Co$_3$B among X-ray diffraction peaks measured using a Cu-Kα ray. The reason that the X-ray diffraction intensity of the (200) plane of Co$_2$B and the X-ray diffraction intensity of the (121) plane of Co$_3$B are used as indices is because the peak of the (200) plane of Co$_2$B and the peak of the (121) plane of Co$_3$B do not overlap with other compound peaks and are independent from the other compound peaks as long as being within the ranges of the compositions of the present invention.

When the sputtering target material according to the present invention comprises the balance of Fe and unavoidable impurities, the intensity ratio [I (Fe$_3$B)/I (Fe$_2$B)] of the X-ray diffraction intensity [I (Fe$_3$B)] of Fe$_3$B (121) to the X-ray diffraction intensity [I (Fe$_2$B)] of Fe$_2$B (200) is 1.50 or less. The intensity ratio [I (Fe$_3$B)/I (Fe$_2$B)] is, for example, 1.4 or less, 1.3 or less, 1.2 or less, 1.1 or less, 1.0 or less, 0.9 or less, 0.8 or less, 0.7 or less, 0.6 or less, or 0.5 or less. The lower limit value of the intensity ratio [I (Fe$_3$B)/I (Fe$_2$B)] is 0.0. The X-ray diffraction intensity [I (Fe$_2$B)] of Fe$_2$B (200) means the intensity of the peak belonging to the (200) plane of Fe$_2$B among X-ray diffraction peaks measured using a Cu-Kα ray, and the X-ray diffraction intensity [I (Fe$_3$B)] of Fe$_3$B (121) means the intensity of the peak belonging to the (121) plane of Fe$_3$B among X-ray diffraction peaks measured using a Cu-Kα ray. The reason that the X-ray diffraction intensity of the (200) plane of Fe$_2$B and the X-ray diffraction intensity of the (121) plane of Fe$_3$B are used as indices is because the peak of the (200) plane of Fe$_2$B and the peak of the (121) plane of Fe$_3$B do not overlap with other compound peaks and are independent from the other compound peaks as long as being within the ranges of the compositions of the present invention.

(CoFe)$_3$B, Co$_3$B, and Fe$_3$B are not stable as compounds, and therefore cause particles in sputtering when being present in a sputtering target material. In contrast, in the present invention, the rates of (CoFe)$_3$B, Co$_3$B, and Fe$_3$B with respect to (CoFe)$_2$B, (Co$_2$B), and Fe$_2$B which are steadily formed as stable compounds so that the contents of B are in a range of 10 to 50% are adjusted so that X-ray diffraction intensity ratios [I [(CoFe)$_3$B]/I [(CoFe)$_2$B]], [I (Co$_3$B)/I (Co$_2$B)], and [I (Fe$_3$B)/I ((Fe$_2$B)] are 1.50 or less, whereby particles can be reduced in sputtering. (CoFe)$_3$B and (CoFe)$_2$B are obtained by replacing some of Co atoms in Co$_3$B and (Co$_2$B) by Fe atoms, respectively.

EXAMPLES

The sputtering target material according to the present invention will be specifically described below with reference to Examples.

A molten raw material was weighed to achieve each composition shown in Tables 1 and 2, induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. A solidification rate can be controlled by adjusting the injection pressure of the Ar gas. The solidification rate is increased with increasing the injection pressure. The particle size distribution of a gas-atomized powder can be adjusted by controlling the solidification rate. The width of the particle size distribution is decreased with increasing the solidification rate.

A powder that satisfied any of particle size conditions A, B, and C described later was prepared by removing coarse particles having a particle diameter of 500 μm or more, which were not suitable for molding, from the obtained gas-atomized powder, and then removing fine particles, of which the structure became a rapidly solidified structure due to a great influence by quenching by atomization, from the powder from which the coarse particles had been removed.

The particle size conditions A, B, and C are defined as follows.

The particle size condition A is defined as a condition that the cumulative volume of particles having a particle diameter of 5 μm or less is 10% or less, and the cumulative volume of particles having a particle diameter of 30 μm or less is 40% or less, in the particle size distribution of powder (particle assemblage).

The particle size condition B is defined as a condition that the cumulative volume of particles having a particle diameter of 5 μm or less is 8% or less, and the cumulative volume of particles having a particle diameter of 30 μm or less is 35% or less, in the particle size distribution of a powder (particle assemblage).

The particle size condition C is defined as a condition that the cumulative volume of particles having a particle diameter of 5 μm or less is 5% or less, and the cumulative volume of particles having a particle diameter of 30 μm or less is 30% or less, in the particle size distribution of a powder (particle assemblage).

A powder that satisfies all the particle size conditions A, B, and C is regarded as a powder that satisfies the particle size condition C, and a powder that satisfies the particle size conditions A and B is regarded as a powder that satisfies the particle size condition B.

The removal of the coarse particles having a particle diameter of 500 μm or more can be performed by classification using a sieve having an opening of 500 μm or less, for example, an opening of 250 to 500 μm. The removal of the fine particles for preparing the powder that satisfies any of the particle size conditions A, B, and C can be performed by classification using sieves having an opening of 5 μm or less and/or an opening of 30 μm or less. In the present examples, the removal of the coarse particles having a particle diameter of 500 μm or more, which were not suitable for molding, was performed by classification using a sieve having an opening of 500 μm. The removal of the fine particles for preparing the powder that satisfied the particle size condition A was performed by classification using a sieve having an opening of 35 μm. The removal of the fine particles for preparing the powder that satisfied the particle size condition B was performed by classification using a sieve having an opening of 30 μm. The removal of the fine particles for preparing the powder that satisfied the particle size condition C was performed by classification using a sieve having an opening 25 μm. A particle diameter and a particle size distribution were measured and confirmed by a laser diffraction/scattering-type particle size distribution measurement apparatus (MICROTRAC). The powder that was prepared by removing the coarse particles and the fine particles and satisfied any of the particle size conditions A, B, and C was used as a raw powder. The raw powder was degassing-charged into an SC can having an outer diameter of 220 mm, an inner diameter of 210 mm, and a length of 200 mm. The powder-filled billet described above was sintered under conditions shown in Tables 1 and 2 to produce a sintered body. The solidified molded product produced by the method described above was processed into a disk shape having a diameter of 180 mm and a thickness of 7 mm by wire cut, turning processing, and plane polishing, to form a sputtering target material. Examples of the molding method include, but are not particularly limited to, HIP, hot press, SPS, and hot extrusion.

A molten raw material was weighed to achieve each composition shown in the raw powder column of Table 3, induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. A powder that satisfied any of the particle size conditions A, B, and C was prepared by removing coarse particles having a particle diameter of 500 μm or more, which were not suitable for molding, from the obtained gas-atomized powder, and then removing fine particles, of which the structure became a rapidly solidified structure due to a great influence by quenching by atomization, from the powder from which the coarse particles had been removed. The removal of the coarse particles and the fine particles was performed in manners similar to the manners described above. The particle size distribution of the powder was measured and confirmed by a laser diffraction/scattering-type particle size distribution measurement apparatus (MICROTRAC). Such powders that were prepared by removing the coarse particles and the fine particles and satisfied any of the particle size conditions A, B, and C were used as raw powders. The raw powders were mixed at a mixture ratio shown in Table 3 in a V-type mixer for 30 minutes to thereby form a composition shown in Table 3, and the resultant mixture was degassing-charged into an SC can having an outer diameter of 220 mm, an inner diameter of 210 mm, and a length of 200 mm. The powder-filled billet described above was sintered under conditions shown in Table 3 to produce a sintered body. The solidified molded product produced by the method described above was processed into a disk shape having a diameter of 180 mm and a thickness of 7 mm by wire cut, turning processing, and plane polishing, to form a sputtering target material. Examples of the molding method include, but are not particularly limited to, HIP, hot press, SPS, and hot extrusion.

Comparative Examples are shown in Table 4. A molten raw material was weighed to achieve each composition shown in Table 4, induction-heating melted in a refractory crucible having an Ar gas atmosphere with a reduced pressure or a vacuum atmosphere, then tapped from a nozzle having a diameter of 8 mm in the lower portion of the crucible, and gas-atomized with an Ar gas. Coarse particles having a particle diameter of 500 μm or more, which were not suitable for molding, were removed from the obtained gas-atomized powder, and the powder from which the coarse particles had been removed and from which fine particles were not removed was used as a raw powder. The raw powder was degassing-charged into an SC can having an outer diameter of 220 mm, an inner diameter of 210 mm, and a length of 200 mm. The powder-filled billet described above was sintered under conditions shown in Table 4 to produce a sintered body. The solidified molded product produced by the method described above was processed into a disk shape having a diameter of 180 mm and a thickness of 7 mm by wire cut, turning processing, and plane polishing, to form a sputtering target material.

TABLE 1

| No | Composition of sputtering target material (at. %) | | | Particle size condition | Particle size | Molding temperature (° C.) | Molding time (h) | Molding pressure (MPa) | XRD intensity ratio [I(CoFe$_3$)B]/I(CoFe$_2$)B] [I(Co$_3$B)/I(Co$_2$B)] [I(Fe$_3$B)/I(Fe$_2$B)] | Particle evaluation | Remarks |
|----|------|------|----|----|----|------|---|-----|-----|---|---|
| | Co | Fe | B | | | | | | | | |
| 1 | 31.5 | 58.5 | 10 | A | ≤5 μm: 9% ≤30 μm: 38% | 1000 | 2 | 100 | 1.4 | C | Present Invention Examples |
| 2 | 33.25 | 51.75 | 15 | B | ≤5 μm: 6% ≤30 μm: 33% | 1000 | 2 | 100 | 1.4 | C | |
| 3 | 28 | 52 | 20 | A | ≤5 μm: 6% ≤30 μm: 33% | 1000 | 2 | 100 | 1.5 | C | |

TABLE 1-continued

| No | Co | Fe | B | Particle size condition | Particle size | Molding temperature (°C.) | Molding time (h) | Molding pressure (MPa) | XRD intensity ratio [I(CoFe$_3$)B]/I(CoFe$_2$)B] [I(Co$_3$B)/I(Co$_2$B)] [I(Fe$_3$B)/I(Fe$_2$B)] | Particle evaluation | Remarks |
|----|----|----|----|----|----|----|----|----|----|----|----|
| 4 | 18 | 72 | 10 | A | ≤5 μm: 7% ≤30 μm: 37% | 1000 | 2 | 100 | 1.4 | C | |
| 5 | 60 | 20 | 20 | B | ≤5 μm: 3% ≤30 μm: 32% | 1000 | 2 | 150 | 1.3 | C | |
| 6 | 72 | 8 | 20 | A | ≤5 μm: 3% ≤30 μm: 36% | 1000 | 2 | 150 | 1.5 | C | |
| 7 | 90 | 0 | 10 | C | ≤5 μm: 4% ≤30 μm: 25% | 700 | 3 | 150 | 0.5 | A | |
| 8 | 80 | 0 | 20 | C | ≤5 μm: 2% ≤30 μm: 21% | 800 | 3 | 150 | 0.5 | A | |
| 9 | 70 | 0 | 30 | B | ≤5 μm: 6% ≤30 μm: 32% | 1000 | 3 | 100 | 1.1 | B | |
| 10 | 60 | 0 | 40 | C | ≤5 μm: 4% ≤30 μm: 18% | 1100 | 3 | 100 | 0.0 | A | |
| 11 | 50 | 0 | 50 | C | ≤5 μm: 0% ≤30 μm: 25% | 1100 | 5 | 150 | 0.0 | A | |
| 12 | 83 | 5 | 12 | A | ≤5 μm: 10% ≤30 μm: 40% | 800 | 5 | 150 | 0.9 | A | |
| 13 | 5 | 70 | 25 | B | ≤5 μm: 8% ≤30 μm: 35% | 1100 | 5 | 150 | 1.0 | B | |
| 14 | 62 | 10 | 28 | A | ≤5 μm: 8% ≤30 μm: 39% | 800 | 5 | 150 | 0.9 | A | |
| 15 | 48 | 20 | 32 | A | ≤5 μm: 9% ≤30 μm: 35% | 800 | 5 | 150 | 0.5 | A | |
| 16 | 22 | 40 | 38 | C | ≤5 μm: 5% ≤30 μm: 30% | 900 | 5 | 150 | 0.0 | A | |
| 17 | 25 | 30 | 45 | A | ≤5 μm: 8% ≤30 μm: 38% | 1000 | 4 | 150 | 0.0 | B | |
| 18 | 5 | 45 | 50 | B | ≤5 μm: 5% ≤30 μm: 35% | 1000 | 3 | 100 | 0.0 | B | |
| 19 | 70 | 5 | 25 | A | ≤5 μm: 9% ≤30 μm: 38% | 800 | 5 | 150 | 0.7 | A | |
| 20 | 40 | 40 | 20 | B | ≤5 μm: 5% ≤30 μm: 31% | 800 | 5 | 150 | 0.0 | A | |

TABLE 2

| No | Composition of sputtering target material (at. %) Co | Fe | B | Particle size condition | Particle size | Molding temperature (° C.) | Molding time (h) | Molding pressure (MPa) | XRD intensity ratio [I(CoFe$_3$)B]/I(CoFe$_2$)B] [I(Co$_3$B)/I(Co$_2$B)] [I(Fe$_3$B)/I(Fe$_2$B)] | Particle evaluation | Remarks |
|---|---|---|---|---|---|---|---|---|---|---|---|
| 21 | 60 | 20 | 20 | C | ≤5 μm: 2% ≤30 μm: 27% | 800 | 5 | 150 | 0.1 | A | Present Invention Examples |
| 22 | 0 | 90 | 10 | A | ≤5 μm: 10% ≤30 μm: 39% | 800 | 4 | 130 | 0.0 | A | |
| 23 | 0 | 80 | 20 | A | ≤5 μm: 8% ≤30 μm: 39% | 800 | 5 | 130 | 0.0 | A | |
| 24 | 0 | 70 | 30 | A | ≤5 μm: 10% ≤30 μm: 36% | 700 | 3 | 130 | 0.5 | A | |
| 25 | 0 | 60 | 40 | A | ≤5 μm: 10% ≤30 μm: 39% | 1000 | 5 | 130 | 0.0 | B | |
| 26 | 0 | 50 | 50 | B | ≤5 μm: 7% ≤30 μm: 33% | 1100 | 5 | 130 | 0.5 | B | |

TABLE 3

| No | Composition of sputtering target material (at. %) | Mixed raw powders ( ): mixture ratio | Particle size condition | Particle size | Molding temperature (° C.) | Molding time (h) | Molding pressure (MPa) | XRD intensity ratio [I(CoFe$_3$)B/I(CoFe$_2$)B] [I(Co$_3$B)/I(Co$_2$B)] [I(Fe$_3$B)/I(Fe$_2$B)] | Particle evaluation | Remarks |
|---|---|---|---|---|---|---|---|---|---|---|
| 27 | 20Co—60Fe—20B | Fe—1Co—20B(25) Co—20B(75) | A | ≤5 μm: 8% ≤30 μm: 36% | 1000 | 5 | 150 | 0.1 | B | Present Invention Examples |
| 28 | 40Co—40Fe—20B | Fe—1Co—20B(50) Co—20B(50) | B | ≤5 μm: 7% ≤30 μm: 34% | 1000 | 5 | 100 | 0.2 | B | |
| 29 | 60Co—20Fe—20B | Fe—1Co—20B(75) Co—20B(25) | B | ≤5 μm: 6% ≤30 μm: 32% | 900 | 4 | 130 | 0.2 | B | |
| 30 | 50Co—20Fe—30B | Fe—1Co—30B(28) Co—30B(72) | C | ≤5 μm: 4% ≤30 μm: 28% | 1000 | 2 | 120 | 0.2 | B | |
| 31 | 15Co—45Fe—40B | Fe—1Co—40B(75) Co—40B(25) | B | ≤5 μm: 6% ≤30 μm: 33% | 1100 | 3 | 150 | 0.1 | B | |
| 32 | 40Co—10Fe—50B | Fe—1Co—40B(20) Co—40B(80) | B | ≤5 μm: 5% ≤30 μm: 31% | 1100 | 2 | 150 | 0.2 | B | |

TABLE 4

| No | Composition of sputtering target material (at. %) Co | Fe | B | Particle size | Molding temperature (° C.) | Molding time (h) | Molding pressure (MPa) | XRD intensity ratio [I(CoFe$_3$)B]/I(CoFe$_2$)B] [I(Co$_3$B)/I(Co$_2$B)] [I(Fe$_3$B)/I(Fe$_2$B)] | Particle evaluation | Remarks |
|---|---|---|---|---|---|---|---|---|---|---|
| 33 | 31.5 | 58.5 | 10 | ≤5 μm: <u>11%</u> ≤30 μm: 39% | 1000 | 2 | 100 | <u>1.8</u> | D | Comparative Examples |
| 34 | 33.25 | 61.75 | <u>5</u> | ≤5 μm: 9% ≤30 μm: <u>41%</u> | 1000 | 2 | 100 | <u>1.9</u> | D | |
| 35 | 28 | 52 | 20 | ≤5 μm: <u>12%</u> ≤30 μm: 34% | 1000 | 2 | 100 | <u>2</u> | D | |
| 36 | 18 | 72 | 10 | ≤5 μm: 7% ≤30 μm: <u>42%</u> | 1000 | 2 | 100 | <u>3</u> | D | |
| 37 | 60 | 20 | 20 | ≤5 μm: <u>13%</u> ≤30 μm: 29% | 1000 | 2 | 100 | <u>6</u> | D | |

TABLE 4-continued

| | Composition of sputtering target material (at. %) | | | | Molding temperature (° C.) | Molding time (h) | Molding pressure (MPa) | XRD intensity ratio [I(CoFe₃)B]/I(CoFe₂)B] [I(Co₃B)/I(Co₂B)] [I(Fe₃B)/I(Fe₂B)] | Particle evaluation | Remarks |
|---|---|---|---|---|---|---|---|---|---|---|
| No | Co | Fe | B | Particle size | | | | | | |
| 38 | 72 | 8 | 20 | ≤5 µm: 4% ≤30 µm: <u>43%</u> | 1000 | 2 | 100 | <u>4.5</u> | D | |
| 39 | 70 | 0 | 30 | ≤5 µm: <u>14%</u> ≤30 µm: <u>45%</u> | 1000 | 5 | 150 | <u>8</u> | D | |

NOTE:
The underlined figures fall outside the scope of the present invention.

Nos. 1 to 32 shown in Tables 1 to 3 are present invention examples, while Nos. 33 to 39 shown in Table 4 are Comparative Examples.

X-ray diffraction intensity was evaluated as follows.

The intensity of an X-ray diffraction peak at 2θ=20 to 80° was measured under the condition of a scan speed of 4°/min by using a Cu-Kα ray as an X-ray source.

Among measured X-ray diffraction peaks, the intensity of the peak belonging to the (200) plane of $(CoFe)_2B$ was regarded as the X-ray diffraction intensity [I [$(CoFe)_2B$]] of $(CoFe)_2B$ (200), and the intensity of the peak belonging to the (121) plane of $(CoFe)_3B$ was regarded as the X-ray diffraction intensity [I [$(CoFe)_3B$]] of $(CoFe)_3B$ (121), when the sputtering target material contains both of Co and Fe. The intensity ratio [I [$(CoFe)_3B$]/I [$(CoFe)_2B$]] of the X-ray diffraction intensity [I [$(CoFe)_3B$]] of $(CoFe)_3B$ (121) to the X-ray diffraction intensity [I [$(CoFe)_2B$]] of $(CoFe)_2B$ (200) was calculated.

Among measured X-ray diffraction peaks, the intensity of the peak belonging to the (200) plane of $Co_2B$ was set at the X-ray diffraction intensity [I [$Co_2B$]] of $Co_2B$ (200), and the intensity of the peak belonging to the (121) plane of $Co_3B$ was regarded as the X-ray diffraction intensity [I [$Co_3B$]] of $Co_3B$ (121), when the sputtering target material contains Co but does not contain Fe. The intensity ratio [I [$Co_3B$]/I [$Co_2B$]] of the X-ray diffraction intensity [I [$Co_3B$]] of $Co_3B$ (121) to the X-ray diffraction intensity [I [$Co_2B$]] of $Co_2B$ (200) was calculated.

Among measured X-ray diffraction peaks, the intensity of the peak belonging to the (200) plane of $Fe_2B$ was set at the X-ray diffraction intensity [I [$Fe_2B$]] of $Fe_2B$ (200), and the intensity of the peak belonging to the (121) plane of $Fe_3B$ was regarded as the X-ray diffraction intensity [I [$Fe_3B$]] of $Fe_3B$ (121), when the sputtering target material contains Fe but does not contain Co. The intensity ratio [I [$Fe_3B$]/I [$Fe_2B$]] of the X-ray diffraction intensity [I [$Fe_3B$]] of $Fe_3B$ (121) to the X-ray diffraction intensity [I [$Fe_2B$]] of $Fe_2B$ (200) was calculated.

Figure 1:
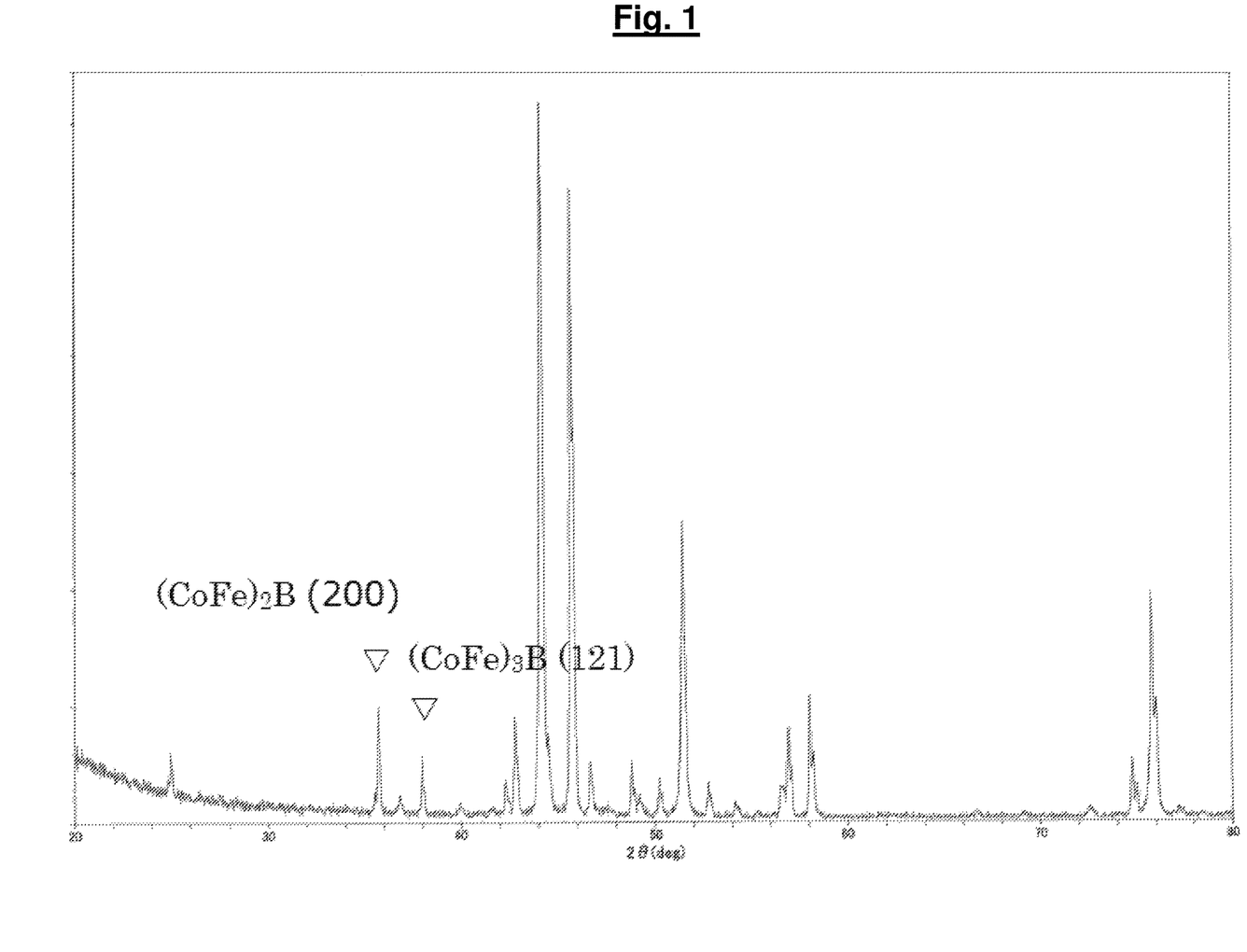
FIG. 1 is a view illustrating an XRD pattern obtained by measuring a sputtering target material according to a present invention example by X-ray diffraction.
Figure 2:
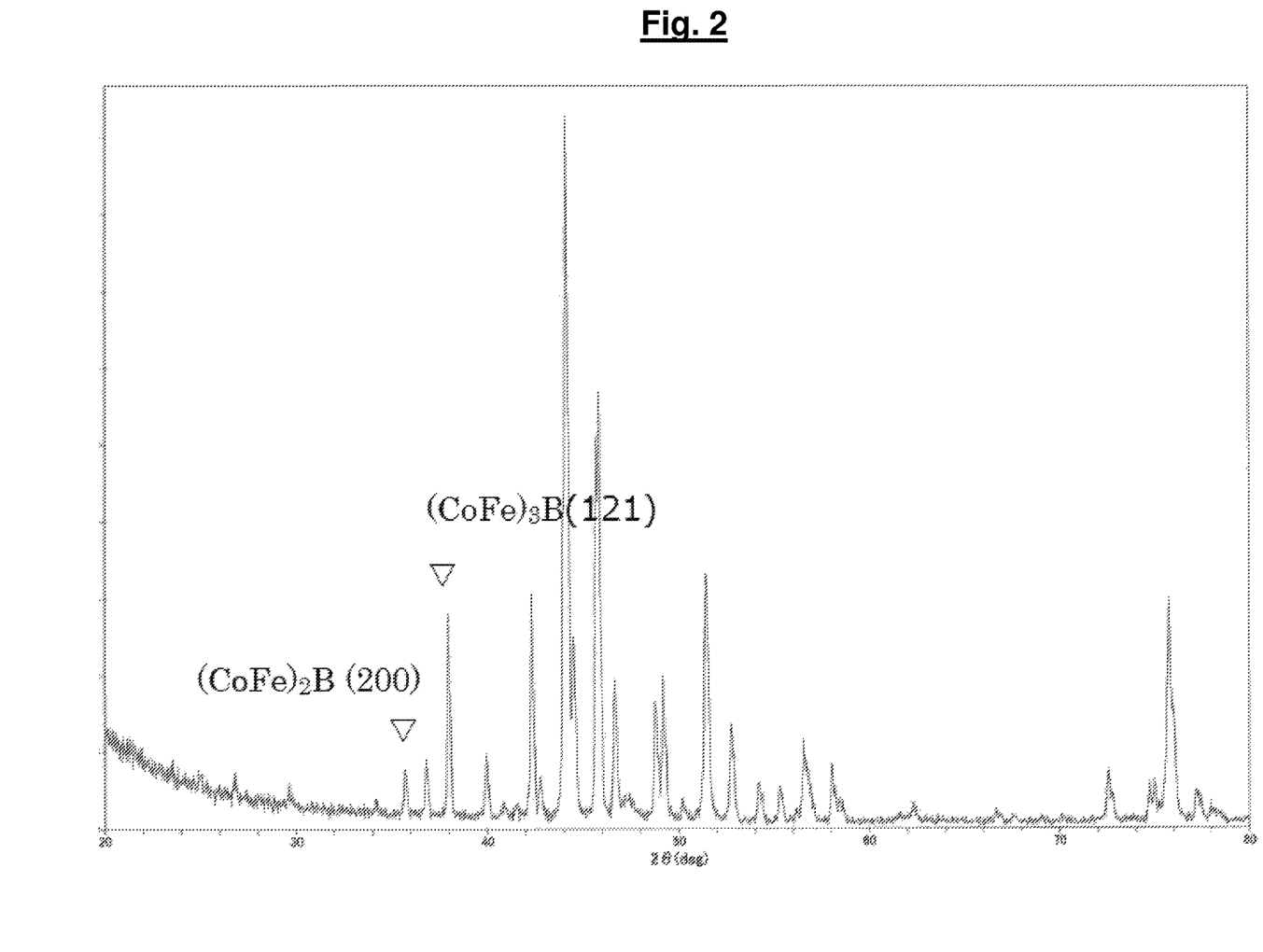
FIG. 2 is a view illustrating an XRD pattern obtained by measuring a sputtering target material according to a comparative example by X-ray diffraction.

As examples of an XRD pattern, the XRD pattern of 70Co-5Fe-25B of a present invention example No. 19 is shown in FIG. 1, and the XRD pattern of 72Co-8Fe-20B of a comparative example No. 38 is shown in FIG. 2.

Particles were evaluated as follows.

A film was formed on an aluminum substrate having a diameter of 95 mm and a sheet thickness of 1.75 mm by DC magnetron sputtering at an Ar gas pressure of 0.9 Pa using the sputtering target materials of each of the present invention examples and the comparative examples, and the number of particles having a size of 0.1 µm or more was evaluated with Optical Surface Analyzer. Particles of which the number was 10 or less were evaluated as excellent and represented by "A", particles of which the number was 11 to 100 were evaluated as good and represented by "B", particles of which the number was 101 to 200 was evaluated as fair and represented by "C", and particles of which the number was 201 or more was evaluated as poor and represented by "D".

In Comparative Example No. 33, an X-ray diffraction intensity ratio was more than 1.5, and consequently, particles were evaluated as very poor because a raw powder satisfied none of the particle size conditions A to C (the cumulative volume of particles having a particle diameter of 5 µm or less was 11% in the particle size distribution of the raw powder).

In Comparative Example No. 34, an X-ray diffraction intensity ratio was more than 1.5, and consequently, particles were evaluated as very poor because the content of B in a sputtering target material was 5%, and a raw powder satisfied none of the particle size conditions A to C (the cumulative volume of particles having a particle diameter of 30 µm or less was 11% in the particle size distribution of the raw powder).

In Comparative Example Nos. 35 and 37, X-ray diffraction intensity ratios were more than 1.5, and consequently, particles were evaluated as very poor because raw powders satisfied none of the particle size conditions A to C (the cumulative volumes of particles having a diameter 5 µm or less were 12% and 13%, respectively, in the particle size distributions of the raw powders).

In Comparative Example Nos. 36 and 38, X-ray diffraction intensity ratios were more than 1.5, and consequently, particles were evaluated as very poor because raw powders satisfied none of the particle size conditions A to C (the cumulative volumes of particles having a particle diameter of 30 µm or less were 42% and 43%, respectively, in the particle size distributions of the raw powders).

In Comparative Example No. 39, an X-ray diffraction intensity ratio was more than 1.5, and consequently, particles were evaluated as very poor because a raw powder satisfied none of the particle size conditions A to C (the cumulative volume of particles having a particle diameter of 5 µm or less and the cumulative volume of particles having a particle diameter of 30 µm or less were 14% and 45%, respectively, in the particle size distribution of the raw powder).

In contrast, each of Present Invention Example Nos. 1 to 32 shown in Tables 1 to 3 resulted in particles evaluated as excellent because of comprising 10 to 50% of B, and the balance of at least one of Co and Fe, and unavoidable impurities, wherein an intensity ratio [I [$(CoFe)_3B$]/I [$(CoFe)_2B$]], an intensity ratio [I ($Co_3B$)/I ($Co_2B$)], or an intensity ratio [I ($Fe_3B$)/I ($Fe_2B$)] was 1.50 or less.

As described above, fine particles, of which the structure becomes a rapidly solidified structure due to a great influence by quenching from atomization, are removed from an atomized powder produced by rapid solidification by gas atomization, whereby $(CoFe)_3B$, $Co_3B$, or $Fe_3B$ which is not a stable phase in the rapidly solidified structure is removed, and the amount of $(CoFe)_3B$, $Co_3B$, or $Fe_3B$ present in a sputtering target material can be reduced by using, as a raw powder of the sputtering target material, the atomized powder from which $(CoFe)_3B$, $Co_3B$, or $Fe_3B$ has been removed. As a result, the X-ray diffraction intensity $[I\ [(CoFe)_3B]]$ of $(CoFe)_3B$ (121), the X-ray diffraction intensity $[I\ (Co_3B)]$ of $Co_3B$ (121), or the X-ray diffraction intensity $[I\ (Fe_3B)]$ of $Fe_3B$ (121) can be decreased, and particles in sputtering can be reduced to improve the product yield of a sputtering film by setting the intensity ratio $[I\ [(CoFe)_3B]/I\ [(CoFe)_2B]]$ of the X-ray diffraction intensity $[I\ [(CoFe)_3B]]$ of $(CoFe)_3B$ (121) to the X-ray diffraction intensity $[I\ [(CoFe)_2B]]$ of $(CoFe)_2B$ (200), the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200), or the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) at 1.50 or less.

The invention claimed is:

1. A sputtering target material comprising in at. %: 10 to 50% of B; and the balance of at least one of Co and Fe, and unavoidable impurities,
   wherein the intensity ratio $[I\ [(CoFe)_3B]/I\ [(CoFe)_2B]]$ of the X-ray diffraction intensity $[I\ [(CoFe)_3B]]$ of $(CoFe)_3\ B$ (121) to the X-ray diffraction intensity $[I\ [(CoFe)_2B]]$ of $(CoFe)_2B$ (200), the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200), or the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) is 1.50 or less.

2. The sputtering target material according to claim 1, wherein the sputtering target material comprises the balance of Co and Fe, and unavoidable impurities; and the intensity ratio $[I\ [(CoFe)_3B]/I\ [(CoFe)_2B]]$ of the X-ray diffraction intensity $[I\ [(CoFe)_3B]]$ of $(CoFe)_3B$ (121) to the X-ray diffraction intensity $[I\ [(CoFe)_2B]]$ of $(CoFe)_2B$ (200) is 1.50 or less.

3. The sputtering target material according to claim 1, wherein the sputtering target material comprises the balance of Co and unavoidable impurities; and the intensity ratio $[I\ (Co_3B)/I\ (Co_2B)]$ of the X-ray diffraction intensity $[I\ (Co_3B)]$ of $Co_3B$ (121) to the X-ray diffraction intensity $[I\ (Co_2B)]$ of $Co_2B$ (200) is 1.50 or less.

4. The sputtering target material according to claim 1, wherein the sputtering target material comprises the balance of Fe and unavoidable impurities; and the intensity ratio $[I\ (Fe_3B)/I\ (Fe_2B)]$ of the X-ray diffraction intensity $[I\ (Fe_3B)]$ of $Fe_3B$ (121) to the X-ray diffraction intensity $[I\ (Fe_2B)]$ of $Fe_2B$ (200) is 1.50 or less.

* * * * *